US006987424B1

(12) United States Patent
Hein

(10) Patent No.: US 6,987,424 B1
(45) Date of Patent: Jan. 17, 2006

(54) NARROW BAND CLOCK MULTIPLIER UNIT

(75) Inventor: Jerrell Hein, Driftwood, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 10/187,938

(22) Filed: Jul. 2, 2002

(51) Int. Cl.
*H03B 27/00* (2006.01)

(52) U.S. Cl. .................................................. 331/53

(58) Field of Classification Search ................ 331/176, 331/16, 53, 76; 455/260, 76, 313, 323; 327/105, 291, 292, 298, 299
See application file for complete search history.

(56) References Cited

U.S. PATENT DOCUMENTS 3,968,493 A 7/1976 Last et al.
4,184,206 A * 1/1980 Harano ...................... 382/269
4,237,423 A 12/1980 Rhodes
4,371,974 A 2/1983 Dugan
5,005,016 A 4/1991 Schmidt et al.
5,027,085 A 6/1991 DeVito
5,036,298 A 7/1991 Bulzachelli
5,239,561 A 8/1993 Wong et al.
5,373,255 A 12/1994 Bray et al.
5,559,841 A 9/1996 Pandula
5,942,949 A 8/1999 Wilson et al.
5,952,892 A 9/1999 Szajda
5,973,570 A * 10/1999 Salvi et al. ................... 331/16
5,995,812 A * 11/1999 Soleimani et al. .......... 455/119
6,008,703 A 12/1999 Perrott et al.
6,075,388 A 6/2000 Dalmia
6,075,416 A 6/2000 Dalmia
6,097,777 A * 8/2000 Tateishi et al. ............. 375/376
6,111,712 A 8/2000 Vishakhadatta et al.
6,125,158 A 9/2000 Carson et al.
6,137,372 A 10/2000 Welland
6,147,567 A 11/2000 Welland et al.
6,150,891 A 11/2000 Welland et al.
6,151,152 A 11/2000 Neary
6,167,245 A 12/2000 Welland et al.
6,208,211 B1 3/2001 Zipper et al.
6,208,216 B1 * 3/2001 Nasila ........................ 332/110
6,519,722 B1 * 2/2003 Wiggins .................... 714/707

(Continued)

FOREIGN PATENT DOCUMENTS

JP 62-81813 4/1987

OTHER PUBLICATIONS

Silicon Laboratories, Product Specification, Si5020, SiPHY™ Multi-Rate Sonet/SDH Clock and Data Recoivery IC, Preliminary Rev. 0.6 Jul. 2000, 2000, pp. 1-16.

(Continued)

*Primary Examiner*—My-Trang Nuton
*Assistant Examiner*—Cassandra Cox
(74) *Attorney, Agent, or Firm*—Zagorin O'Brien Graham LLP

(57) ABSTRACT

A clock multiplier unit (CMU) used for a high speed communications system is supplied with an input reference clock and utilizes a narrowband phase-locked loop (PLL) to multiply the reference clock to supply a higher speed output clock used, e.g., as a FIFO read clock. The narrowband PLL sufficiently attenuates jitter in jitter frequencies of interest thereby allowing a relaxation of the jitter requirement for the input reference clock. The low speed clock used to write the FIFO may also be used as the reference clock. The bandwidth of the PLL may be selectable to accommodate reference clocks with different jitter specifications. The narrowband PLL transfer function may also be used to meet overall jitter transfer function requirements.

25 Claims, 11 Drawing Sheets

U.S. PATENT DOCUMENTS

| | | | | |
|---|---|---|---|---|
| 6,531,926 | B1 * | 3/2003 | Pate et al. | 331/17 |
| 6,538,518 | B1 * | 3/2003 | Chengson | 331/17 |
| 6,590,426 | B2 | 7/2003 | Perrott | |
| 6,630,868 | B2 | 10/2003 | Perrott et al. | |

OTHER PUBLICATIONS

Andersson, L. I. et al, "Silicon Bipolar Chipset for SONET/SDH 10 Gb/s Fiber-Optic Communication Links," IEEE Journal of Solid-State Circuits, vol. 30, No. 3, Mar. 1995, pp. 210-218.

Belot, D. et al., "A 3.3-V Power Adaptive 1244/622/155 Mbit/s Transceiver for ATM, SONET/SDH," Journal of Solid-State Circuits, vol. 33, No. 7, Jul. 1998, pp. 1047-1058.

Gray, C. T. et al., "A Sampling Technique and Its CMOS Implementation with 1 Gb/s Bandwidth and 25 ps Resolution," IEEE Journal of Solid-State Circuits, vol. 29, No. 3, Mar. 1994, pp. 340-349.

Guiterrez G. et al., "2.488 Gb/s Silicon Bipolar Clock and Data Recovery IC for SONET (OC-48)," IEEE 1998 Custom Integrated Circuits Conference, pp. 575-578.

Guiterrez, G. and Kong, S., "Unaided 2.5 Gb/s Silicon Bipolar Clock and Data Recovery IC," VIII-7, 1998 IEEE Radio Frequency Integrated Circuits Symposium, pp. 173-176.

Hogge, Charles R., Jr., "A Self Correcting Clock Recovery Circuit," IEEE Journal of Lightwave Technology, vol. LT-3, Dec. 1985, pp. 1312-1314, re-printed as pp. 249-251.

Hu, T. H. and Gray, P. R., "A Monolithic 480 Mb/s Parallel AGC/Decision/Clock-Recovery Circuit in 1.2-$\mu$m CMOS," IEEE Journal of Solid-State Circuits, vol. 28, No. 12, Dec. 1993, pp. 1314-1320.

Jarman, David, "A Brief Introduction to Sigma Delta Conversion," Application Note AN9504, Intersil Corporation, May 1995, pp. 1-7.

Kawai, K. et al., "A 557-mW, 2.5-Gbit/s SONET/SDH Regenerator-Section Terminating LSI Chip Using Low-Power Bipolar-LSI Design," IEEE Journal of Solid-State Circuits, vol. 34, No. 1, Jan. 1999, pp. 12-17.

Lee, T. H. and Bulzacchelli, J. F., "A 155-MHz Clock Recovery Delay- and Phase-Locked Loop," IEEE Journal of Solid-State Circuits, vol. SC-27, Dec. 1992, pp. 1736-1746, re-printed as pp. 421-430.

Lee, T. H. et al., "A 2.5 V. CMOS Delay-Locked Loop for an 18 Mbit, 500 Megabyte/s DRAM," IEEE Journal of Solid-State Circuits, vol. 29, No. 12, Dec. 1994, pp. 1491-1496.

Perrott, M. et al., "A 27mW CMOS Fractional-N Synthesizer/Modulator IC," 1997 IEEE International Solid-State Circuits Conference, Session 22, Communications Building Blocks II, Paper SP 22.2, 1997 Digest of Technical Papers, vol. 40, pp. 366-367, 487.

Perrott, M. et al., "A 27mW CMOS Fractional-N Synthesizer Using Digital Compensation for 2.5-Mb/s GFSK Modulation," IEEE Journal of Solid-States Circuits, vol. 32, No. 12, Dec. 1997, pp. 2048-2060.

Pottbacker, A. et al., "A Si Bipolar Phase and Frequency Detector IC for Clock Extraction up to 8 Gb/s," IEEE Journal of Solid-State Circuits, vol. 27, No. 12, Dec. 1992, pp. 1747-1751.

Razavi, Behzad, "Design of Monolithic Phase-Locked Loops and Clock Recovery Circuits—A Tutorial," Monolithic Phase-Locked Loops and Clock Recovery Circuits—Theory and Design, ed. B. Razavi, IEEE Press, N.Y., 1996, pp. 1-39.

Walker, R. C. et al., "A 10Gb/s Si-Bipolar TX/RX Chipset for Computer Data Transmission," IEEE International Solid-State Circuits Conference, Session 19, Paper 19.1 Slide Supplement, 1998, pp. 19.1-1-19.1-11.

Walker, R. C. et al., "A 1.5 Gb/s Link Interface Chipset for Computer Data Transmission," IEEE Journal on Selected Areas in Communications, vol. 9, No. 5, Jun. 1991, pp. 698-703.

Weston, H. T. et al., "A Submicrometer NMOS Multiplexer-Demultiplexer Chip Set for 622.08-Mb/s SONET Applications," IEEE Journal of Solid-State Circuits, vol. 27, No. 7 Jul. 1992, pp. 1041-1049.

Willingham, S. et al., "An Integrated 2.5GHz $\Sigma\Delta$ Frequency Synthesizer with 5 $\mu$s Settling and 2Mb/s Closed Loop Modulation," 2000 IEEE International Solid-State Circuits Conference, Session 12, Paper TP 12.3, pp. 200-201, 457.

Masaru Kokubo et al, "FA 15.2: A Fast-Frequency-Switching PLL Synthesizer LSI with a Numerical Phase Comparator," IEEE International Solid-State Circuits Conference, New York, vol. 38, Feb. 1, 1995, pp. 260-261, 376.

Shayan, Y. R. et al., "All Digital Phase-Locked Loop: Concepts, Design and Applications," IEEE Proceedings-F/Radar and Signal Processing 136, Stevenage, Herts, GB, vol. 136, no. 1, Part F, Feb. 1, 1989, pp. 53-56.

Broadcom Corporation, BCM8110 Product Brief, 9.953 GBPS Integrated Low Power SONET/SDH Transistor, 2002.

Gloeckle, Steven, "Ameritech OC-3, OC-12, OC-48 And OC-192 Service Interface Specifications,"0 AM-TR-NIS-000111, SBC Corporation, 2000, pp. 15-16.

"HFTA-04.0: Optical/Electrical Conversion in SDH/SONET Fiber Optic Systems," Dallas Semiconductor MAXIM, App. 649, Jun. 28, 2000, 11 pages, <http://www.maxim-ic.com/appnotes.cfm/ appnote_number/649>.

Guinea, Jesus, et al., "A Single Chip 155Mbps/140Mbps SDH/PDH Transceiver," IEEE 2000 Custom Integrated Circuits Conference, pp. 315-318.

Ishii, Kiyoshi, et al., "A Jitter Suppression Technique for a 2.48832-Gb/s Clock and Data Recovery Circuit," ISCAS 2000—IEEE International Symposium on Circuits and Systems, May 28-31, 2000, Geneva, Switzerland, pp. V261-V264.

Kishine, Keiji, et al., "A 2.5-Gb/s Clock and Data Recovery IC with Tunable Jitter Characteristics for Use in LAN's and WAN's," IEEE Journal of Solid-State Circuits, vol. 34, No. 6, Jun. 1999, pp. 805-812.

Kishine, Keiji, et al., "Loop-Parameter Optimization of a PLL for a Low-Jitter 2.5-Gb/s One-Chip Optical Receiver IC With 1 : 8 DEMUX," IEEE Journal of Solid-State Circuits, vol. 37, No. 1, Jan. 2000, pp. 38-50.

Noguchi, H., et al., "A 9.9G-10.8 Gb/s Rate-Adaptive Clock and Data-Recovery with No External Reference Clock for WDM Optical Fiber Transmission," ISSCC 2002, Session 15, Gigabit Communications, Feb. 5, 2002, 3 pages (see especially Fig. 15.3.5).

Pertessis, John, "Fast Testing Techniques for OC-192," EET-ASIA/semicon, Apr. 2001, <http://www.eetasia.convARTICLES/2001Apr/2001Apr01_NTEK_RFD_TA1.PDF>, 4 pages.

* cited by examiner

NARROW BAND CLOCK MULTIPLIER UNIT

BACKGROUND

1. Field of the Invention

This invention relates to clocking in electronic systems and more particularly to managing jitter in high speed clocking environments.

2. Description of the Related Art

High speed clocks are used in transmission systems to synchronize the flow of data. Those high speed clocks may include jitter, which should be managed to prevent bit errors. Jitter is the variation in clock output frequency from a desired output frequency and can occur for a number of reasons. For example, jitter may be caused by noise introduced into the system from any of a variety of sources. A critical area of jitter management is in the transmit path of an optical/electrical interface where the outgoing light pulses typically have jitter within tight system requirements.

A typical transmit path of an electrical/optical interface is illustrated in FIG. 1. Low speed data that is supplied by the system on node 101 is written into a First In First Out (FIFO) memory 103 using a low speed clock supplied on node 105. A clock multiplier unit (CMU) 107 generates a high speed clock on node 109. The CMU 107 is configured as a phase-locked loop (PLL) and uses a lower speed reference clock supplied on node 111 as its input, which is multiplied to provide the high speed clock on node 109. The high speed clock generated by the CMU 107 is used to read data out of FIFO 103 and send it to a laser driver and laser 113 for optical transmission.

A typical CMU utilizes a wideband PLL, which passes virtually all of the jitter present on its input (the reference clock) to the output. Thus, a very low jitter clock reference source, such as a high quality crystal oscillator, has been used in order to meet the transmit jitter generation requirements. In this context "wideband" is defined as a PLL with closed loop bandwidth above or at the high end of the jitter frequencies of interest for output jitter generation. For example, for an OC-48 Synchronous Optical Network (SONET) system, having a data rate of approximately 2.5 GHz, transmit jitter is specified for jitter frequencies from 12 KHz to 20 MHz. A wideband PLL typically used in such a system would have a closed loop bandwidth that encompasses a substantial portion of the frequency range of the jitter frequencies of interest, e.g., a closed loop bandwidth of 15 MHz.

The need for a high precision clock source adds expense to a system both in terms of the cost of a high precision crystal oscillator, particularly at frequencies above 100 MHz, as well as additional complexity in design and board layout. In addition, reference clocks are often distributed across backplanes, making low jitter difficult to obtain. It would be desirable to relax the tight jitter requirements of the reference clock in order to remove the need for a high precision clock source, which would simplify system design and implementation and reduce its cost.

SUMMARY

Accordingly, the invention provides in one embodiment a clock multiplier unit that has a narrowband PLL that multiplies an input reference clock to generate a higher speed clock that can be used, e.g., for supplying high speed serial data from a FIFO memory. The narrowband PLL attenuates jitter in the jitter frequencies of interest sufficiently to allow a relaxation of the jitter requirements for the input reference clock. A narrowband CMU can save costs in reference clock generation because of the lower jitter requirements or alternatively, in some embodiments, can entirely remove the need to separately generate a low jitter reference clock to drive the clock multiplier unit by instead using an existing low speed clock as the reference clock, such as the clock used to write data into the FIFO.

In one embodiment the invention provides a clock multiplier/multiplexer transmit circuit arrangement that includes an input terminal coupled to receive a reference clock signal. A clock multiplier circuit on the integrated circuit includes a phased-locked loop circuit coupled to receive the reference clock signal and to supply an output clock as a multiple of the input clock. The phase-locked loop has a narrowband transfer function to attenuate jitter that is present in the reference clock in a predetermined frequency range, thereby providing an output clock substantially free of jitter present in the reference clock.

In another embodiment the invention provides a method of operating an integrated circuit that includes receiving a reference clock at an input terminal of the integrated circuit and generating an output clock as a multiple of the reference clock utilizing a phase-locked loop having a narrow frequency band transfer function. The method further includes attenuating jitter present in the reference clock in a predetermined frequency range in the phase-locked loop circuit of the clock multiplier circuit.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
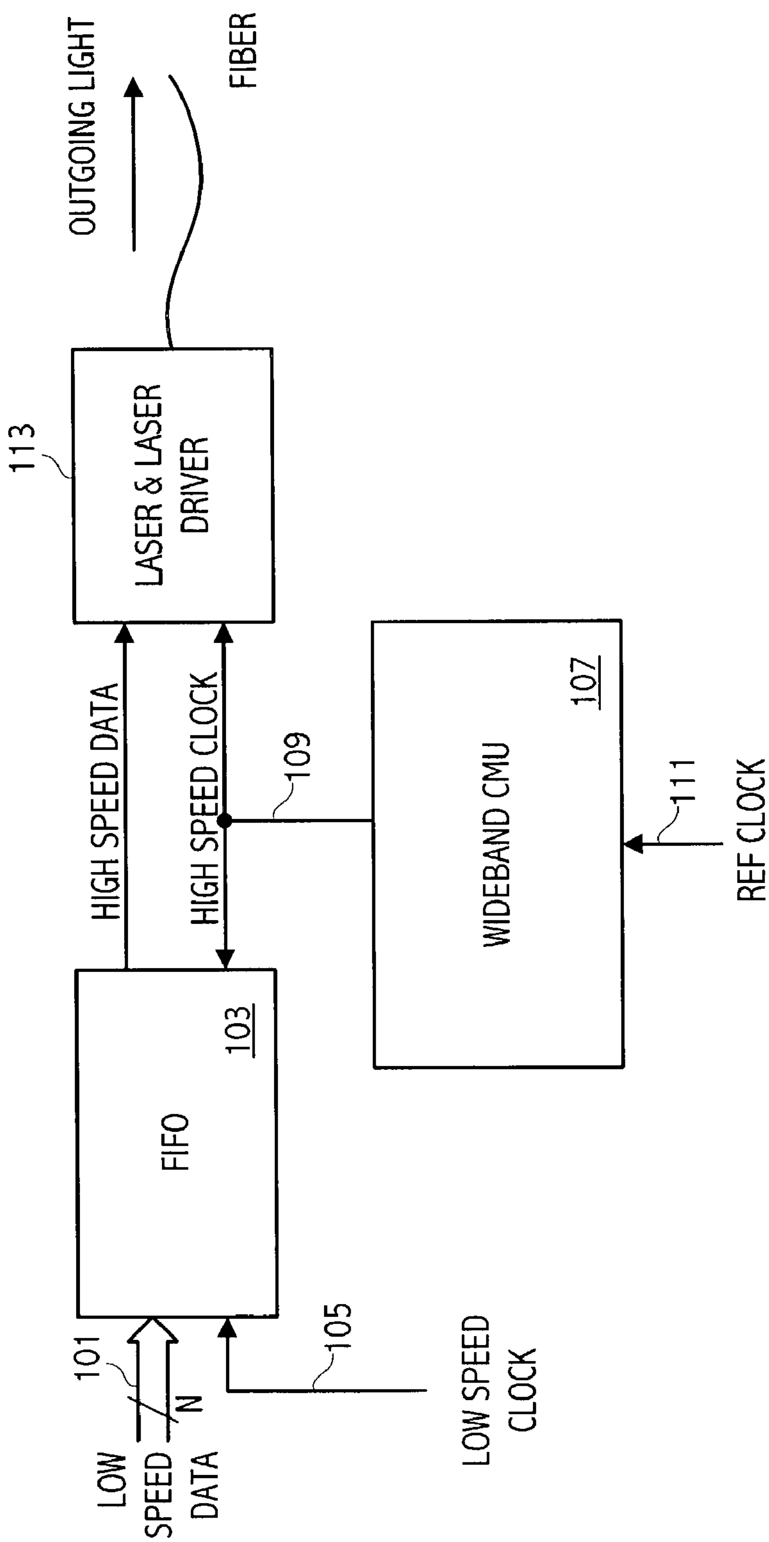
FIG. 1 shows a typical prior art architecture of a transmit path of an electrical/optical interface.
Figure 2:
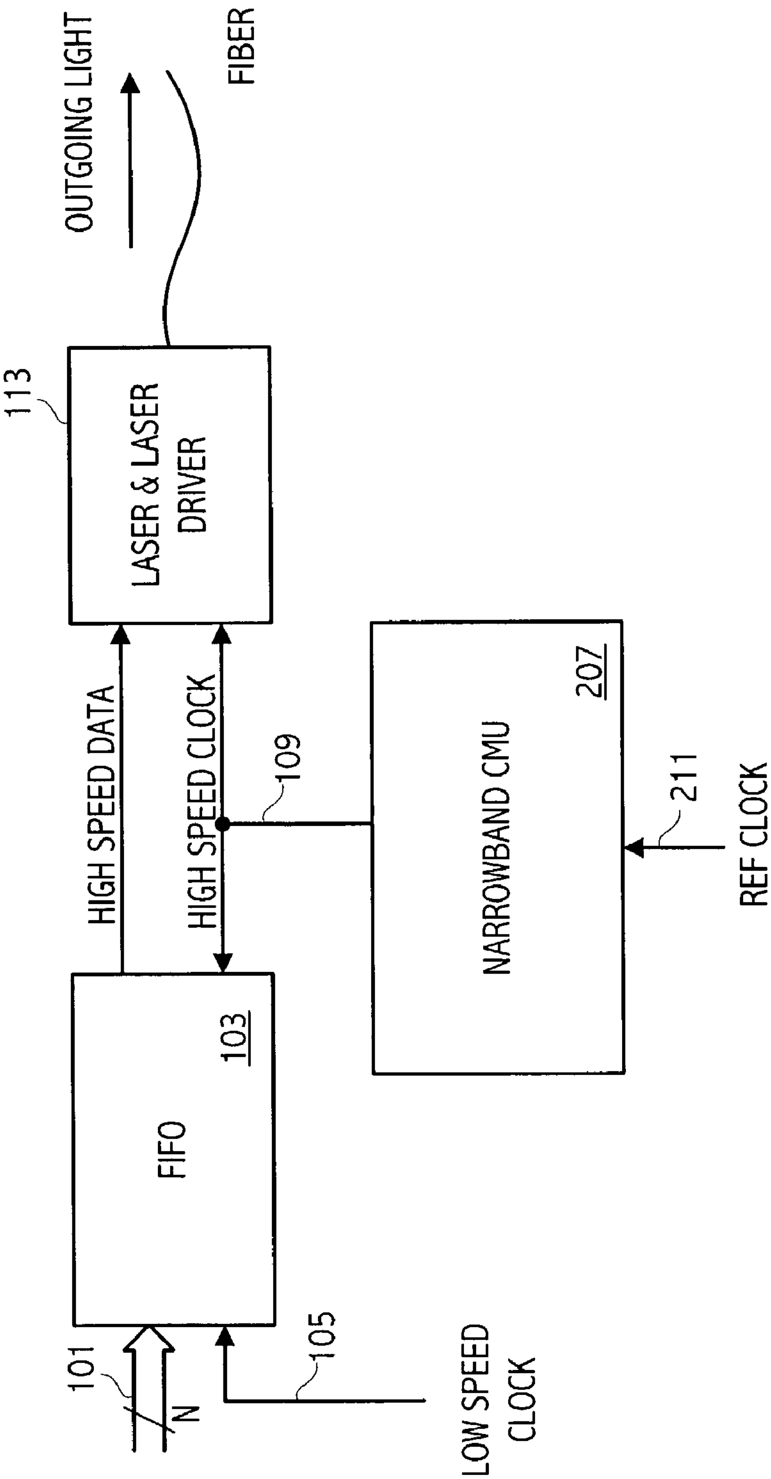
FIG. 2 shows an architecture of a transmit path of an electrical/optical interface according to an embodiment of the invention.

FIG. 2 illustrates an architecture of an electrical/optical interface in a communications system in accordance with one embodiment of the present invention. The clock multiplier unit 207 utilizes a narrow band PLL that attenuates jitter on the reference clock 211 that is supplied to the PLL allowing the reference clock to be of lower precision as compared to previously described prior art systems. The narrowband CMU 207 does not pass a significant portion of the jitter present on its input clock to the output, thus easing the precision requirements for the input clock.

However, a narrow band PLL tends to internally generate more jitter than a wideband PLL. Therefore, in order for a narrowband PLL to meet the jitter requirements at the output, the generated jitter as well as the passed jitter should be considered. One aspect of controlling generated jitter is to use a low noise voltage controlled oscillator (VCO). Additional details on a suitable narrowband PLL and lower noise VCO are provided herein. A narrow band PLL as used herein means a PLL that has a closed loop bandwidth below or at the low end of the jitter frequencies of interest for output jitter generation. For example, for a clock multiplier unit utilized in an OC-48 system, a jitter bandwidth of, e.g., 40 KHz would be considered narrowband, where the jitter frequencies of interest are from 12 KHz to 20 MHz. In OC 192 systems, the jitter frequencies of interest range from approximately 50 KHz to 80 MHz. A jitter bandwidth of e.g., 175 KHz, would be considered narrowband.

Use of a low-noise VCO in a narrow band PLL helps the CMU to meet jitter specifications while relaxing the jitter requirements of the reference clock 211, which drives the CMU. The relaxed jitter requirements allows a less expensive clock source than the high quality crystal oscillator typically used in previous systems.

Figure 3:
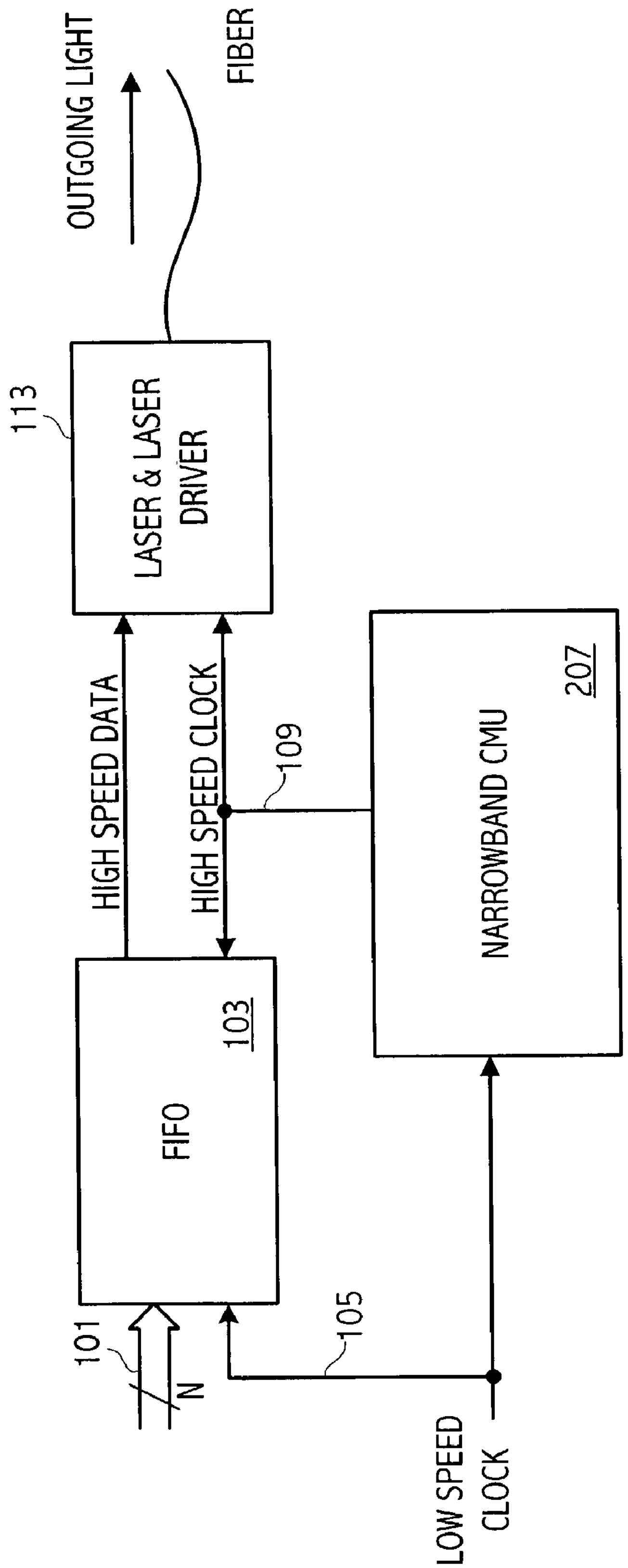
FIG. 3 shows an architecture of a transmit path of an electrical/optical interface according to an embodiment of the invention.

Referring to FIG. 3, another embodiment is shown in which the low speed clock 105 is supplied to the narrowband CMU 207 as the reference clock. Low speed clock 105 is also used to clock data into FIFO 103. Since that clock exists in the system already, the requirement for a separate reference clock can be eliminated altogether providing additional design simplification.

Figure 4:
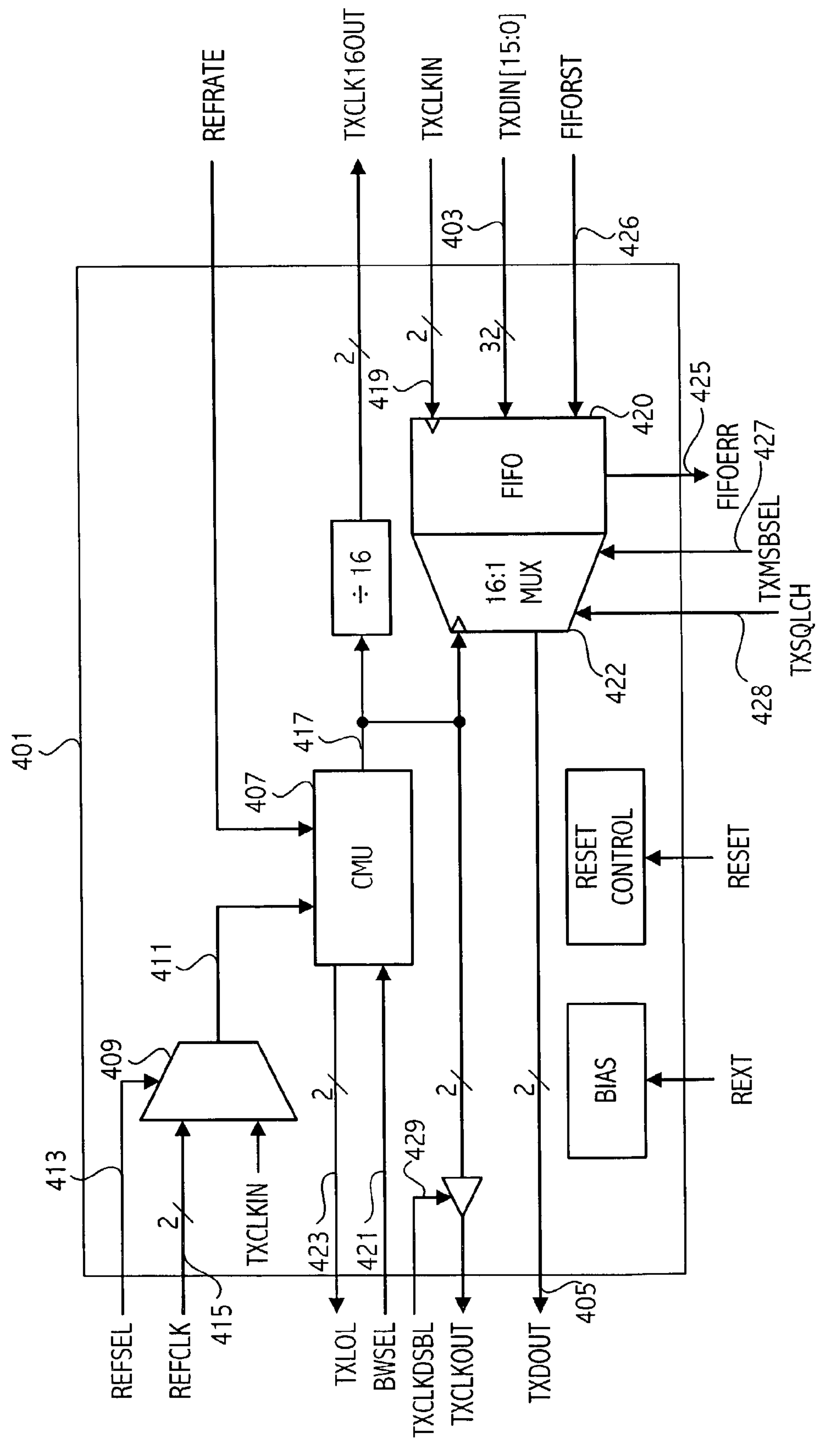
FIG. 4 shows a clock multiplier unit/multiplexer transmit circuit incorporating an embodiment of the present invention.

Referring to FIG. 4, an exemplary clock multiplier unit/multiplexer transmit circuit 401 that incorporates an embodiment of the present invention is illustrated. In one embodiment transmit circuit 401 is implemented as a single integrated circuit. The transmit circuit 401 receives parallel data on node 403 and supplies high speed serial data TXDOUT on node 405. The serial data is supplied to a laser driver and laser circuit (not shown). Note that the parallel and serial data are shown as differential signals. Although those and others clock and data signals are shown in FIG. 4 as differential, the clock and data signals may also be implemented as single-ended and the principles described herein are still applicable.

The transmit circuit 401 includes a narrow band CMU 407, an embodiment of which is described further herein. The transmit circuit 401 incorporates a selector circuit (such as a multiplexer) 409, which selects the source for the reference clock 411 supplied to the CMU 407 according to a reference clock select signal 413 (REFSEL), supplied on an input terminal of the integrated circuit 401. In other embodiments, the reference clock select signal may be programmably set by, e.g., a serial communications port on the integrated circuit. The clocks that are selectable in the illustrated embodiment include a clock supplied on node 415 and the clock TXCLKIN supplied on node 419, which is used to clock data into the FIFO. Use of the FIFO clock 419 as the CMU reference clock allows a simpler design of the module containing the clock multiplier unit/multiplexer transmit circuit 401 in that a separate reference clock no longer needs to be supplied.

The CMU 407 supplies a clock signal on node 417, which is used to read data out of the FIFO 420. In the illustrated embodiment, a 16:1 multiplexer is used to select the bit of the 16 bit word written into the FIFO for serial output on node 405.

The CMU in the exemplary transmitter multiplies the frequency of the selected reference clock up to the serial transmit data rate. Examples of typical input reference data frequencies of interest are 78 MHz, 155 MHz and 622 MHZ, with typical output frequencies being 2.5 GHz and 10 GHz. Other embodiments may of course utilize different input and output clock frequencies.

The TXLOL output signal on node 423 provides an indication of the transmit CMU lock status. When the CMU has achieved lock with the selected reference, the TXLOL output is deasserted (driven high). The TXLOL signal will be asserted, indicating a transmit CMU loss-of-lock condition, when a valid clock signal is not detected on the selected reference clock input. The TXLOL signal will also be asserted during frequency calibration. Calibration is performed automatically when the exemplary transmit circuit is powered on, when a valid clock signal is detected on the selected reference clock input following a period when no valid clock was present, or when the frequency of the selected reference clock is outside of the CMU's PLL lock range.

In an embodiment of the invention, the closed loop bandwidth of the PLL is programmable. Thus, the PLL can be adjusted to better optimize output jitter given the reference clock input jitter specifications. If the reference clock has high jitter, the narrower bandwidths can be selected but if the reference clock has lower jitter, the loop bandwidth can be somewhat greater. In an embodiment, four bandwidth settings are provided for a variety of jitter transfer characteristics. The filter bandwidth may be selected via input terminals. In one embodiment, the filter bandwidth is selected via the BWSEL[1:0] control inputs on node 421. In one embodiment used in OC192 applications, the selectable closed loop PLL bandwidths are 17.5 KHz, 90 KHz, 175 KHz, and 350 KHz. Other embodiments will have other appropriate cutoff frequencies based on the application. In a digital loop filter implementation, the loop filter bandwidth may be controlled by adjusting the digital filter without modifying external components, as would be the case in traditional analog PLL implementations.

Lower loop bandwidth settings (narrowband operation) make the CMU more tolerant to jitter on the reference clock source. As a result, circuitry used to generate and distribute the physical layer reference clocks can be simplified without compromising margin to the SONET/SDH jitter specifications. Higher loop bandwidth settings (wideband operation) are useful in applications where the reference clock is provided by a low jitter clock source. Wideband operation allows the PLL to more closely track the precision reference source.

In an embodiment, the serialization circuitry includes FIFO 420 and multiplexer 422. The serialization circuitry may utilize a parallel to serial shift register. Low speed data on the parallel input bus, TXDIN[15:0] on node 403, is latched into the FIFO on the rising edge of TXCLKIN. Data is clocked out of the FIFO and into the shift register by a clock that is produced by dividing down the high-speed transmit clock, TXCLKOUT, by a factor of 16. The high-speed serial data stream TXDOUT is clocked out of the shift register by TXCLKOUT. The TXCLK16OUT clock is provided as an output signal to support data word transfers between the transmitter and upstream devices using a counter clocking scheme.

The exemplary transmit circuit described above decouples the timing of the data transferred into the device via TXCLKIN from the data transferred out of the shift register. The FIFO is eight parallel words deep and accommodates any static phase delay that may be introduced between TXCLKOUT and TXCLKIN. Furthermore, the FIFO accommodates a phase drift, or wander, between TXCLKIN and TXCLKOUT of up to, e.g., plus or minus three parallel data words. The FIFO circuitry indicates an overflow or underflow condition by asserting the FIFOERR signal supplied on node 425. This output can be used to re-center the FIFO read/write pointers by tying it directly to the FIFORST input on node 426. The FIFORST signal causes re-centering of the FIFO read/write pointers. The exemplary transmit circuit automatically recenters the read/write pointers after the device is powered on, after an external reset via the RESET input, and each time the PLL transitions from an out-of-lock state to a locked state (when TXLOL transitions from low to high).

The exemplary transmit circuit provides the capability to select the order in which the data received on the parallel input bus TXDIN[15:0] is transmitted serially on the high-speed serial data output TXDOUT. Data on the parallel bus will be transmitted MSB first or LSB first depending on the setting of the TXMSBSEL input provided on node 427. When TXMSBSEL is set low, TXDIN0 is transmitted first, followed in order by TXDIN1 through TXDIN15. When TXMSBSEL is set high, TXDIN15 is transmitted first, followed in order by TXDIN14 through TXDIN0. This feature can simplify printed circuit board (PCB) routing in applications where ICs are mounted on both sides of the PCB.

In one embodiment, to prevent the transmission of corrupted data into the network, the multiplier unit/multiplexer provides a control pin that can be used to force the high-speed serial data output TXDOUT to zero. When the TXSQLCH input on node 428 is set low, the TXDOUT signal is forced to a zero state.

In the illustrated embodiment, a clock disable pin, TXCLKDSBL, on node 429 can be used to disable the high-speed serial data clock output, TXCLKOUT. When the TXCLKDSBL pin is asserted, the positive and negative terminals of CLKOUT are tied internally to 1.5 V through 50 ohm on-chip resistors. That feature can be used to reduce power consumption in applications that do not use the high-speed transmit data clock.

As previously described, a narrowband PLL may generate undesirable jitter in the synthesis of the output clock. One embodiment of a narrow band PLL that generates sufficiently low jitter during output clock synthesis is now described. In one embodiment, the CMU 407 utilizes a digital signal processing (DSP) algorithm to replace the loop filter commonly found in analog PLL designs. This algorithm processes the phase detector error term and generates a digital control value to adjust the frequency of the voltage-controlled oscillator (VCO). The digital implementation requires no external loop filter components. That eliminates sensitive noise entry points, making the PLL implementation less susceptible to board-level noise sources, and making SONET/SDH jitter compliance easier to attain in the application.

Figure 5:
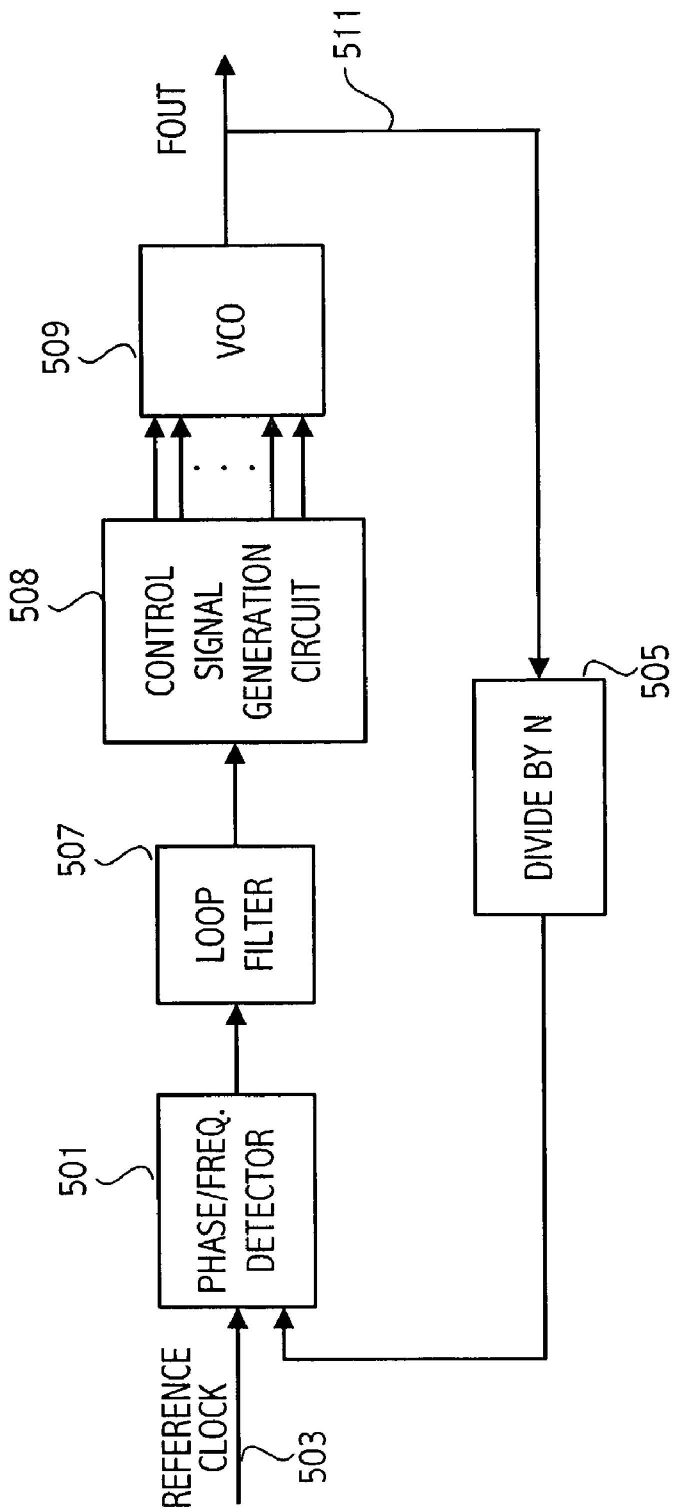
FIG. 5 shows a block diagram of a PLL suitable for use in an embodiment of the clock multiplier unit.

Referring to FIG. 5, a high level block diagram of an embodiment of a phase-locked loop (PLL) suitable for use in the CMU is illustrated. The PLL includes a phase/frequency detector 501 which receives the reference clock supplied on node 503. As illustrated in FIG. 4, reference clock 503 may be supplied by the multiplexer 409 (FIG. 4). The phase and frequency detector detects the phase and frequency difference between the supplied reference clock a feedback signal supplied from the divide-by-N circuit 505. The phase/frequency detector 501 supplies a signal to a digital loop filter 507 which supplies control signal generation circuit 508, which in turn supplies control signals to the voltage controlled oscillator (VCO) 509. The output of the VCO 509 supplied on node 511 is fed back through the divide-by-N circuit 505 to the phase/frequency detector 501 and provides the high speed output clock TXCLKOUT generated by the CMU.

Figure 6:
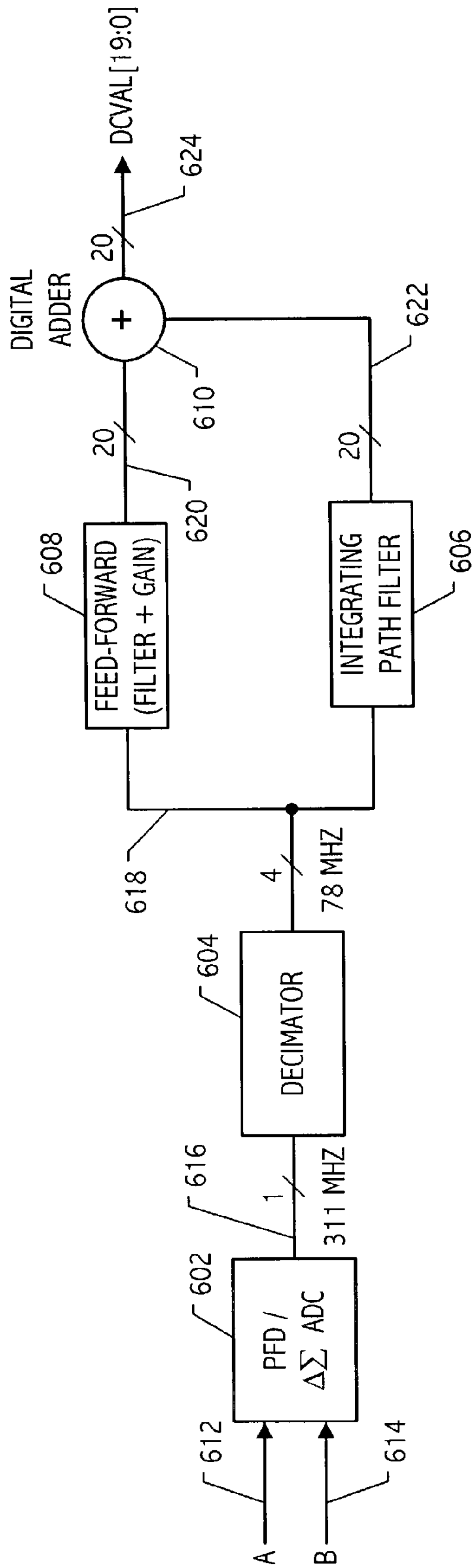
FIG. 6 shows an a portion of an exemplary PLL suitable for use in an embodiment of the clock multiplier unit.

Referring now to FIG. 6, a portion of a PLL is shown that includes a loop filter, and a phase detector 602, which compares phase or phase/frequency between two signals A and B conveyed respectively on nodes 612 and 614 and generates an error signal on output node 616. The A signal is the selected reference clock and the B signal is a feedback signal from the divide-by-N circuit coupled to the output of the VCO (not shown in FIG. 6). The phase detector circuit 602 preferably includes a linear phase detection circuit followed by a delta-sigma modulator to generate a 1-bit digital bit-stream error signal. Other phase detectors, e.g., bang—bang phase detectors may be utilized in embodiments of the invention. In the illustrated embodiment in FIG. 6, the phase detector circuit 602 may be assumed to produce a 311 MHz 1-bit wide error signal 616. Exemplary digital phase detector circuits are described in the U.S. patent application Ser. No. 09/902,542 by Perrott, filed Jul. 10, 2001, and also in the U.S. Provisional Application 60/360,461, filed Feb. 28, 2002, entitled "Method and Apparatus for Switching Between Input Clocks in a Phase-Locked Loop" by Huang, et. al., which are incorporated herein by reference.

The error signal 616 is received by a decimator circuit 604 that produces a lower frequency, wider bit-width error signal on its output node 618, which is then conveyed to both a digital feed-forward block 608 and a digital integrating path filter 606. In the example depicted, the decimated error signal is a 4-bit wide 78 MHz signal which is preferably calculated by adding each of several weighted sequential data bits in the input bit stream. For example, four sequential data bits may be each weighted by a factor of two and added to produce an unsigned output having a range from 0000 to 1000. In a preferred embodiment each 4-bit value of the decimated error signal may be calculated by adding: a first data bit weighted by a factor of one; the next three data bits each weighted by a factor of two; and a fifth data bit weighted by a factor of one. This technique simultaneously provides decimation, gain, and digital low-pass filtering.

Figure 7:
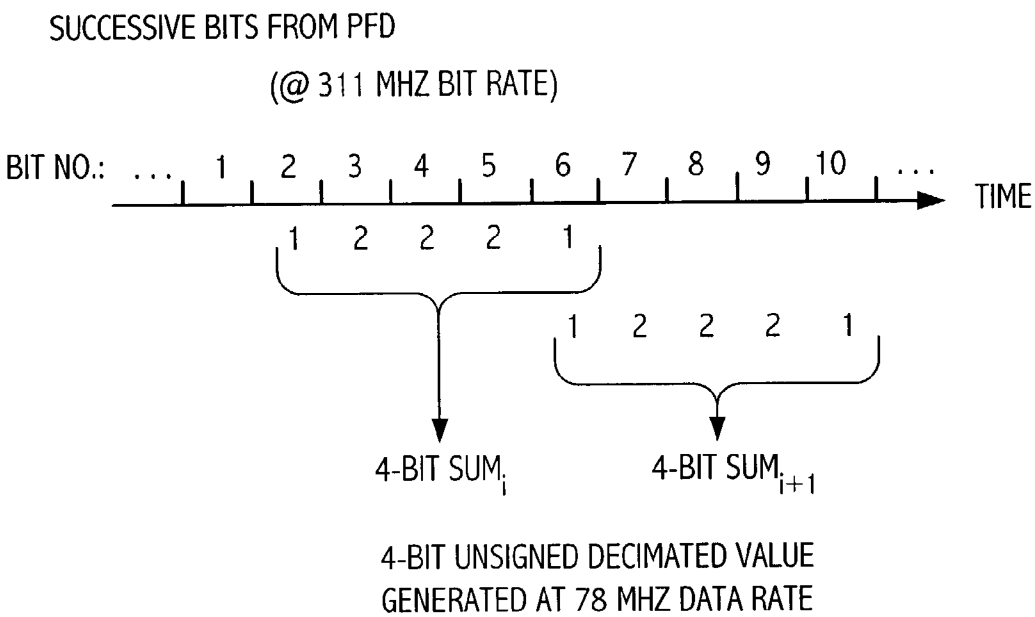
FIG. 7 shows successive data bits of the error signal sent to the decimator circuit shown in FIG. 6 and illustrates operation of the decimator circuit.

Such a calculation is shown in FIG. 7, which depicts successive data bits of the error signal supplied to the decimator circuit 604. A four-bit value SUM[3:0] is calculated by adding: BIT[2] weighted by a factor of one; BIT[3] weighted by a factor of two; BIT[4] weighted by a factor of two; BIT[5] weighted by a factor of two; and BIT[6] weighted by a factor of one. The next four-bit value SUM [i+1] is calculated by adding: BIT[6] and BIT[10], each weighted by a factor of one; and BIT[7], BIT[8], and BIT[9] after each is weighted by a factor of two. Consequently, the overall gain of this block is two (i.e., in aggregate each bit is weighted by a factor of two) and the overlapping summation technique results in a filtering effect. With an overall gain of two, and since a calculation is performed for every four sequential input data bits, the calculated output values may range from 0000 to 1000. This unsigned value is preferably converted to a signed value ranging from 1100 (−4) through 0000 (0) to 0100 (+4), although such conversion may be performed in the decimator circuit 604 or in the succeeding circuit stages. Alternatively, such succeeding stages may be designed to directly operate using an unsigned input value, without an explicit conversion to a signed value. In the descriptions herein, the decimator circuit 604 may be considered to be part of the PLL loop filter, but a similar decimation circuit or function may alternatively be considered to be part of a more complex phase detector circuit 602.

Referring again to FIG. 6, the decimator circuit 604 produces a 4-bit wide error signal at a 78 MHz data rate on its output node 618, which is then conveyed to both a feed-forward block 608 and an integrating path filter 606. The feed-forward block 608 and integrating path filter 606 are preferably both digital circuits that generate output values such as 20-bit values, as shown, although it is understood that other circuits and other output widths may be employed as well. The respective outputs 620 and 622 of these blocks are added by digital adder 610 to preferably produce on output node 624 a 20-bit digital control signal DCVAL[19:0] for the VCO. The integrating path filter 606 preferably incorporates digital signal processing circuitry and/or digital signal processing techniques as described generally in the U.S. patent application Ser. No. 09/902,541 by Perrott, et al., filed Jul. 10, 2001. For some embodiments, the function depicted by the digital adder 610 may be incorporated into a subsequent circuit block which receives both output signals 620 and 622.

Figure 8:
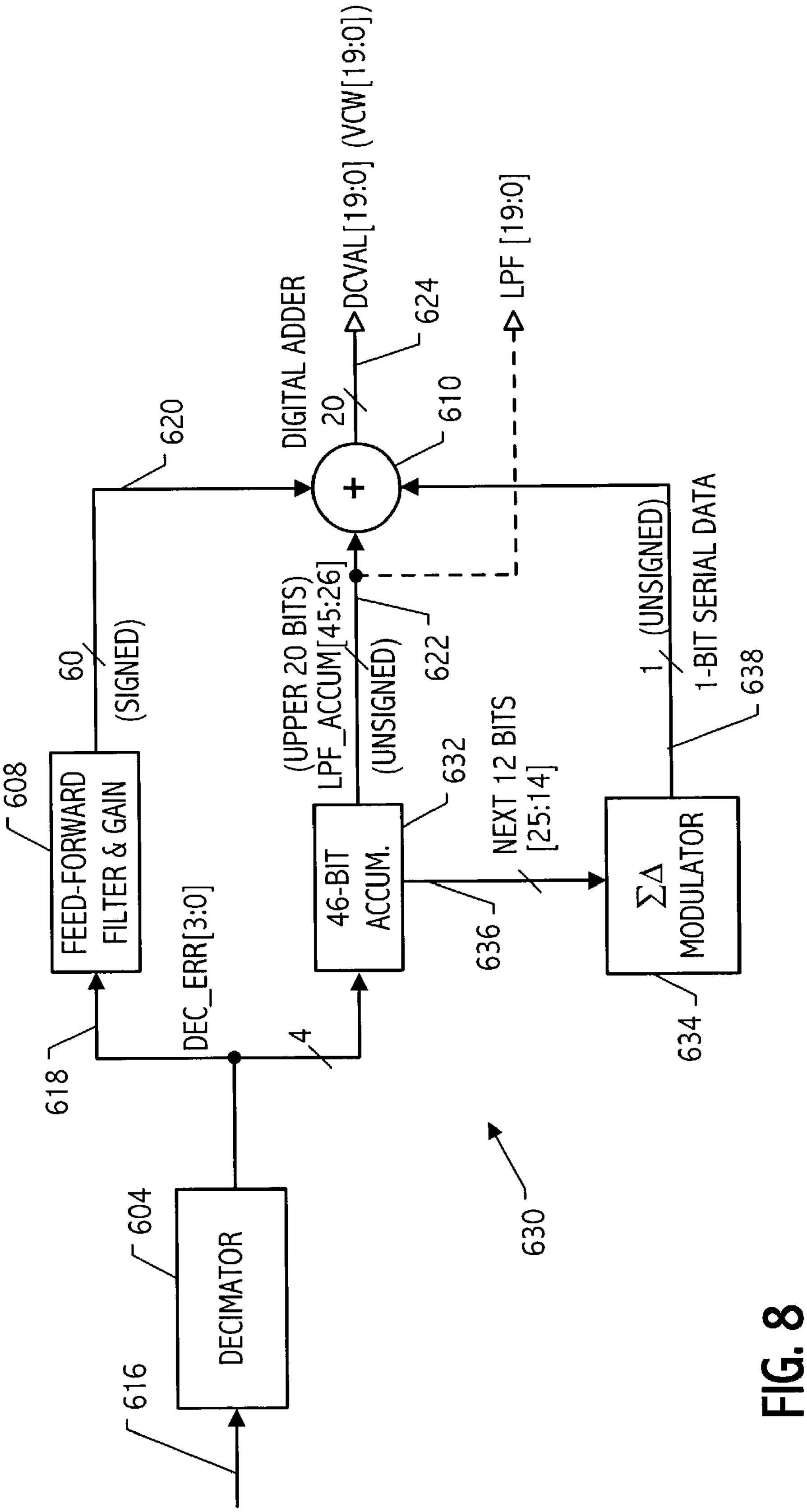
FIG. 8 illustrates a portion of an exemplary PLL suitable for use in an embodiment of the clock multiplier unit.
Figure 9:
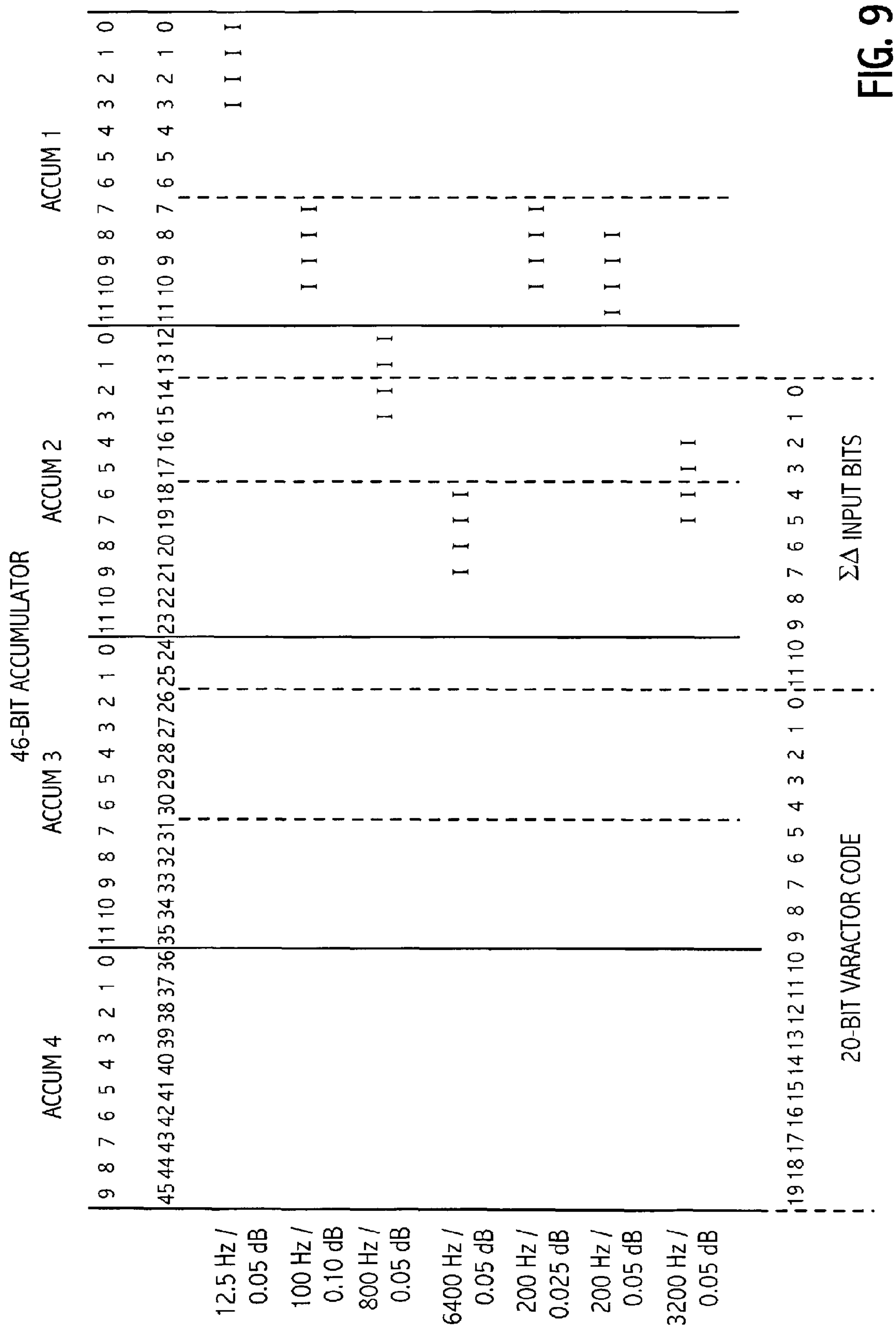
FIG. 9 illustrates how peaking may be selected in an embodiment of the invention.

Referring now to FIG. 8, an embodiment of a digital loop filter 630 is depicted. The 4-bit decimated error signal 618 is conveyed to a digital accumulator circuit 632 which sums the 4-bit decimated error signal 618 and accumulates up to a 46-bit result. The particular bit position of the digital accumulator circuit 632 into which the 4-bit decimated error signal 618 is added is configurable in accordance with a selected peaking setting for the PLL transfer function, as indicated in FIG. 9. For example, for a selected bandwidth of 12.5 Hz and peaking of 0.05 dB (i.e., the top line in the chart), the 4-bit decimated error signal DEC_ERR[3:0] conveyed on node 618 is added at bit positions LPF_ACCUM[3:0] of the low pass filter accumulator (indicated by the "I I I I" characters for integrating path), and a 46-bit result is accumulated on bits LPF_ACCUM[45:0]. Alternatively, for a selected bandwidth of 6400 Hz/0.05 dB, the 4-bit decimated error signal DEC_ERR[3:0] is added at bit positions LPF_ACCUM[21:18], and a 28-bit result is accumulated on bits LPF_ACCUM[45:18], with the lower 18 bit positions LPF_ACCUM[17:0] being ignored.

Irrespective of the bandwidth and peaking selected, the low-pass filter digital output signal conveyed on node 622 is preferably an upper portion of the accumulator, such as the upper 20-bits of the accumulator, namely LPF_ACCUM [45:26] for this example. As shown in FIG. 8, this output signal may be a 20-bit unsigned data word, although internally the upper 10 bits of the accumulator may preferably be signed bits.

Figure 10:
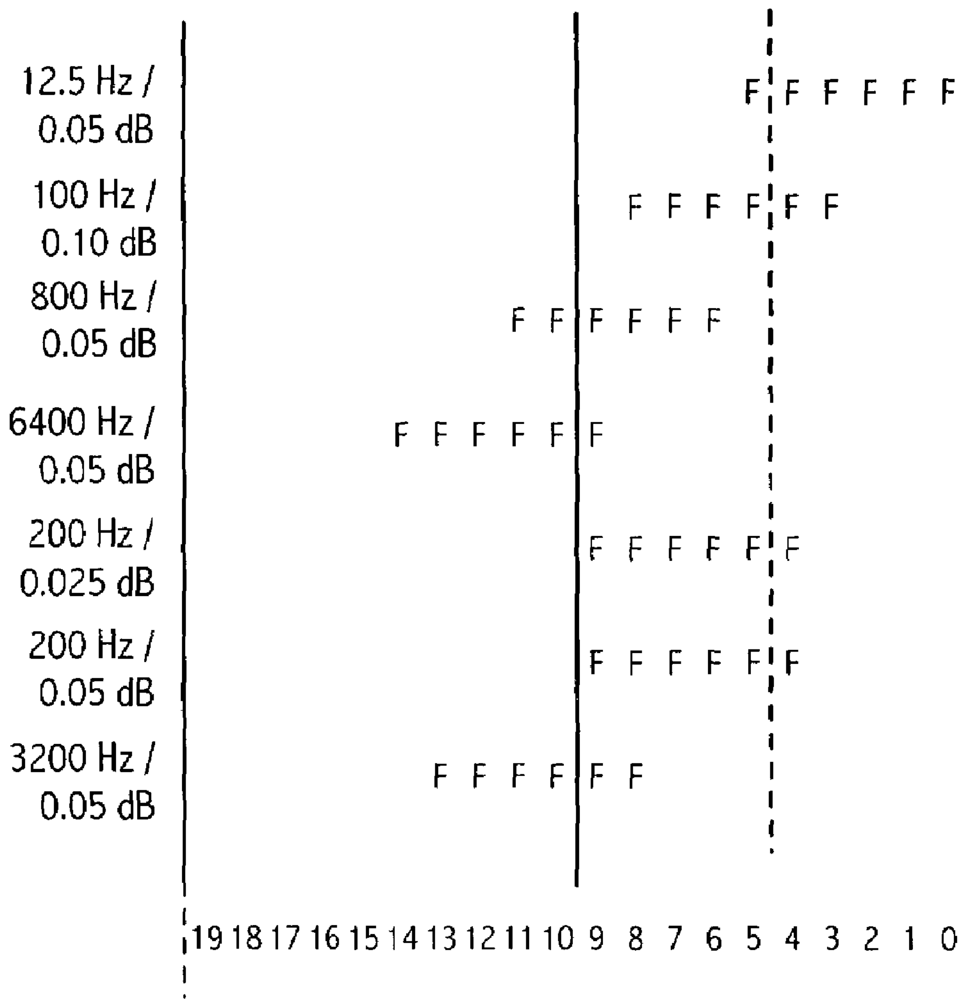
FIG. 10 illustrates how loop bandwidth may be selected in an embodiment of the invention.

The feed-forward filter 608 preferably has a gain of 4 and consequently has an output that is preferably a signed 6-bit data word. The feed forward path includes a low pass finite impulse response (FIR) filter. The feed forward filter generates a 6-bit output signal 620 (with sign extension), and the two signals 620 and 622 are added by digital adder circuit 610 to generate on node 624 (i.e., in this case, bus 624) a 20-bit VCO control signal DCVAL[19:0]. Referring to FIG. 10, the particular bit position of the 20-bit value into which the 6-bit feed-forward filter output signal is added in digital adder 610, is configurable in accordance with a selected bandwidth for the PLL transfer function. Note that the 6 bits conveyed on node 620 may be supplied as part of a zero filled 20 bit value into which the 6 bits have been mapped according to a desired bandwidth. For example, the 6-bit feed-forward filter output signal may be mapped to be added into bit positions [5:0] indicated by the "F F F F F F" characters for a selected bandwidth of 12.5 Hz and peaking of 0.05 dB (i.e., the top line in the chart). It should be noted that the "F F F F F F" position determines the PLL's bandwidth while the "I I I I" position (FIG. 9) and the "F F F F F F" position together determine the PLL's peaking.

An extremely long low pass filter time constant may be achieved in the digital accumulator circuit 632 by calculating up to an internal 46-bit result, but not all of these bits must necessarily be conveyed to subsequent circuits, such as the VCO control signal generation circuit, especially if such succeeding circuits cannot make use of the 46-bit resolution. In the exemplary embodiment shown, the output value of the low pass filter may be taken from only the upper 20-bits of the accumulator and represented herein also as LPF[19:0]. However, in certain embodiments, some additional precision may be maintained beyond just the upper 20-bit value by conveying a group of the next lower accumulator bits to a sigma-delta modulator circuit 634 that generates, for example, a 1-bit serial data bit stream representative of those bits, and adding the resulting 1-bit serial output bit stream to the upper 20-bits to generate another 20-bit result. Any given value of the DCVAL[19:0] signal will, of course, have only 20-bits of resolution, but a large group of sequential values of the DCVAL[19:0] signal will generate an average value which is representative of 32-bits of resolution, not just 20-bits, even though only 20-bits are conveyed to subsequent circuit blocks.

Additional details on generating the control word for the VCO and alternative PLL implementations are provided in provisional application 60/360,333, filed Feb. 28, 2002, entitled "DIGITAL EXPANDER APPARATUS AND METHOD FOR GENERATING MULTIPLE ANALOG CONTROL SIGNALS PARTICULARLY USEFUL FOR CONTROLLING A SUB-VARACTOR ARRAY OF A VOLTAGE CONTROLLED OSCILLATOR", by Yunteng Huang and Bruno Garlepp, which application is incorporated herein by reference in its entirety, and in application Ser. No. 10/188,576, entitled "DIGITAL EXPANDER APPARATUS AND METHOD FOR GENERATING MULTIPLE ANALOG CONTROL SIGNALS PARTICULARLY USEFUL FOR CONTROLLING A SUB-VARACTOR ARRAY OF A VOLTAGE CONTROLLED OSCILLATOR", naming Yunteng Huang and Bruno Garlepp as inventors, filed the same day as the present application, which is incorporated herein by reference.

Utilizing a low noise VCO is another aspect of achieving a narrow band PLL suitable for use in the CMU described herein. Referring again to FIG. 5, in one embodiment VCO 509 is implemented as an LC oscillator. Other types of controlled oscillators, such as a current controlled oscillator with a suitable control signal, are also contemplated. Because it is important to minimize jitter, one embodiment of a VCO suitable for use in the present invention uses an LC tank circuit having the inductor being implemented off-die, e.g., in the package, to achieve a higher Q value. In another embodiment an inductor having a small inductance L, and a high quality factor Q may be made to include a surface rotational portion instead of a coil to provide a low inductance inductor with sufficient quality factor. The surface rotational portion is a conducting structure which is substantially enclosed along the length of the structure and which has openings at each end of the structure and an opening along the length of the structure between the end openings. One example of such a structure is a cylinder having a lateral opening and openings at its ends or bases. Another example of such a structure is a duct-shape or rectangular structure. Any appropriately shaped surface may be used to rotate current, and varying thicknesses and lengths may be used as appropriate. Such an inductor is described in more detail in U.S. patent application Ser. No. 09/997,338, filed Nov. 30, 2001, by Ligang Zhang, which is incorporated by reference herein. LC oscillators are described in U.S. Pat. No. 6,137,372 to Welland, which is hereby incorporated by reference. Additional details of various aspects of a PLL and VCOs suitable for use in embodiments of the present invention can be found in the applications entitled "DIGITALLY-SYNTHESIZED LOOP FILTER CIRCUIT PARTICULARLY USEFUL FOR A PHASE LOCKED LOOP", application Ser. No. 09/902,541, filed Jul. 10, 2001, and "FEEDBACK SYSTEM INCORPORATING SLOW DIGITAL SWITCHING FOR GLITCH-FREE STATE CHANGES", application No. 60/300,699, filed Jun. 25, 2001, which are incorporated herein by reference.

Figure 11:
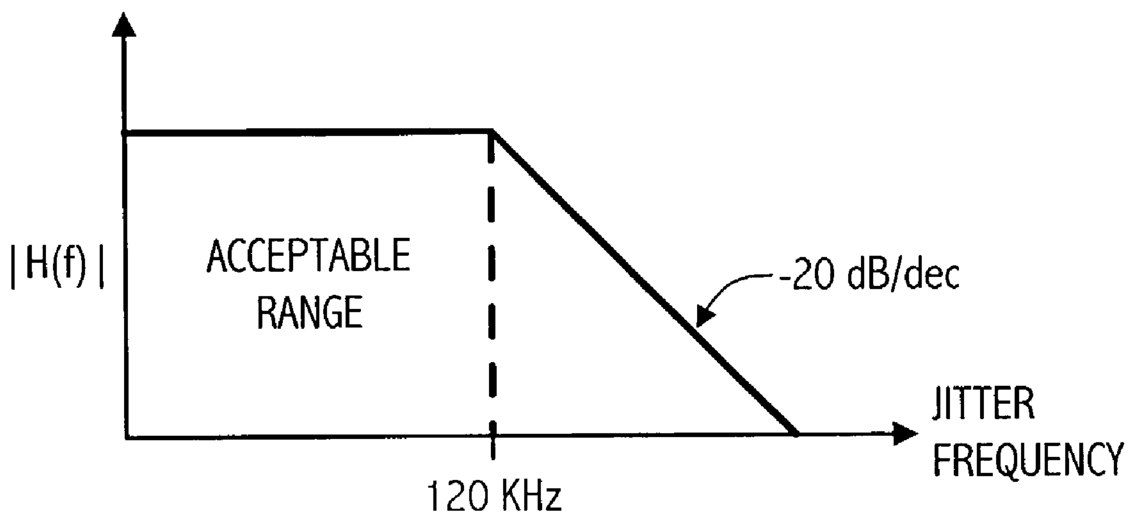
FIG. 11 illustrates a mask that the jitter transfer function from any receive port to any transmit port must meet in OC192 systems.

An additional significant advantage of utilizing a narrowband CMU is that it can be used to meet the jitter transfer function system requirements, either in loopback or in normal operation. For example, in OC192 systems the jitter transfer function from any receive port to any transmit port must meet the mask illustrated in FIG. 11.

Given that the receive PLLs are always wideband in order to meet the input jitter tolerance specifications, the narrowband PLL needed to meet the transfer requirement has typically been implemented elsewhere. Such embodiments use discrete PLLs to generate clean reference clocks and to meet the jitter transfer specifications. This clean reference clock drives a wideband CMU to create the 10 Gb/s output. By using a narrowband CMU in accordance with the present invention, the CMU, reference clock jitter filtering, transmit clock generation, and jitter transfer function requirements can all be handled in one integrated circuit.

Note that OC48 systems do not have the narrowband jitter transfer requirements that OC 192 systems do. For OC48 systems, the receive PLL can meet both the input jitter tolerance and jitter transfer specification of $f_3$ db<1.3 MHz.

While the invention has been largely described with respect to the embodiments set forth above, the invention is not necessarily limited to these embodiments. Variations and modifications of the embodiments disclosed herein may be made based on the description set forth herein, without departing from the scope and spirit of the invention as set forth in the following claims. Accordingly, other embodiments, variations, and improvements not described herein are not necessarily excluded from the scope of the invention, which is defined by the following appended claims.

What is claimed is:

1. An integrated circuit comprising:

an input terminal coupled to receive a reference clock signal; and a clock multiplier circuit including a phased-locked loop circuit coupled to receive the reference clock signal and to supply an output clock as a multiple of the reference clock signal, the phase-locked loop (PLL) having a narrowband transfer function to attenuate jitter that is present in the reference clock in a predetermined frequency range, thereby providing an output clock substantially free of jitter present in the reference clock signal, wherein the PLL has a closed loop bandwidth in or below the low portion of the predetermined frequency range;

a first clock terminal for receiving a first clock and a second clock terminal for receiving a second clock and a selector circuit coupled to select one of the first and second clocks as the reference clock for the clock multiplier circuit; and an input terminal coupled to the selector circuit to control operation of the selector circuit.

2. The integrated circuit as recited in claim 1 further comprising a first in first out (FIFO) memory, the FIFO memory being coupled to receive data using a first clock and coupled to supply data from the FIFO memory at a rate determined by the output clock.

3. The integrated circuit as recited in claim 2 wherein the reference clock signal supplied to the PLL is coupled to the FIFO memory as the first clock.

4. An integrated circuit comprising:

an input terminal coupled to receive a reference clock signal;

a clock multiplier circuit including a phased-locked loop circuit coupled to receive the reference clock signal and to supply an output clock as a multiple of the reference clock signal, the phase-locked loop (PLL) having a narrowband transfer function to attenuate jitter that is present in the reference clock in a predetermined frequency range, thereby providing an output clock substantially free of jitter present in the reference clock signal, wherein the PLL has a closed loop bandwidth in or below the low portion of the predetermined frequency range;

a first clock terminal for receiving a first clock and a second clock terminal for receiving a second clock and further comprising a selector circuit coupled to select one of the first and second clocks as the reference clock for the clock multiplier circuit; and wherein the data is written into the FIFO memory at a rate determined by one of the first and second clocks.

5. The integrated circuit as recited in claim 1 wherein the predetermined frequency range is from approximately 12 KHz to approximately 20 MHz and the closed loop bandwidth is less than approximately 40 KHz.

6. The integrated circuit as recited in claim 2 wherein the integrated circuit further includes a multiplexer to select an output from the FIFO for serial transmission at a rate determined by the output clock.

7. The integrated circuit as recited in claim 1 wherein the bandwidth of the phase-locked loop is selectable between at least two frequencies.

8. An integrated circuit comprising:

an input terminal coupled to receive a reference clock signal;

a clock multiplier circuit including a phased-locked loop circuit coupled to receive the reference clock sigal and to supply an output clock as a multiple of the reference clock signal, the phase-locked loop (PLL) having a narrowband transfer function to attenuate jitter that is present in the reference clock in a predetermined frequency range, thereby providing an output clock substantially free of jitter present in the reference clock signal, wherein the PLL has a closed loop bandwidth in or below the low portion of the predetermined frequency rant:

wherein the bandwidth of the phase-locked loop is selectable between at least two frequencies according to a value of a signal on an input terminal of the integrated circuit.

9. The integrated circuit as recited in claim 1 wherein the clock multiplier circuit having the PLL with the narrowband transfer function meets jitter transfer requirements in addition to jitter attenuation.

10. A method of operating an integrated circuit, comprising:

receiving a reference clock at an input terminal of the integrated circuit;

generating an output clock as a multiple of the reference clock utilizing a phase-locked loop (PLL) having a narrow band transfer function; and attenuating jitter present in the reference clock in a predetermined frequency range in the phase-locked loop (PLL);

providing at least a first and second clock input terminal on the integrated circuit to receive respectively a first and second clock signal; and selecting in a selector circuit one of the signals supplied from the first and second clock input terminals as the reference clock.

11. The method as recited in claim 10 further comprising:

receiving data at a rate determined by a first clock, the first clock being different than the reference clock;

storing the received data in a memory circuit; and supplying data stored in the memory circuit at a rate determined according to the output clock.

12. The method as recited in claim 10 further comprising:

receiving data at a rate determined by the reference clock; and storing the received data into a memory circuit; and supplying data stored in the memory circuit at a rate determined according to the output clock.

13. The method as recited in claim 10 further comprising controlling operation of the selector circuit according to a value of an input terminal of the integrated circuit.

14. The method as recited in claim 10 further comprising:

receiving data at a rate determined by a first clock, the first clock being different than the reference clock;

storing the received data in a memory circuit;

supplying data stored in the memory circuit at a rate determined according to the output clock; and writing data into the memory circuit using the signal selected as the reference clock signal.

15. The method as recited in claim 10 further comprising selecting one of at least two frequency ranges as the bandwidth of the phase-locked loop.

16. A method of operating an integrated circuit, comprising:

receiving a reference clock at an input terminal of the integrated circuit;

generating an output clock as a multiple of the reference clock utilizing a phase-locked loop (PLL) having a narrow band transfer function; and attenuating jitter present in the reference clock in a predetermined frequency range in the phase-locked loop (PLL);

selecting one of at least two frequency ranges as the bandwidth of the phase-locked loop;

selecting the bandwidth according to a value of a signal on an input terminal of the integrated circuit.

17. An apparatus for receiving and sending data comprising:

means for receiving a reference clock at an input terminal of the integrated circuit; and means for generating an output clock as a multiple of the reference clock and attenuating jitter present in the reference clock in a predetermined frequency range, thereby providing an output clock substantially free of jitter present in the reference clock, wherein the means for generating has a closed loop bandwidth below or at the low end of the predetermined frequency range, thereby attenuating jitter present in the predetermined frequency range;

a plurality of input terminals;

memory means for storing data; and means for selecting between one of two possible clock signals provided on the input terminals as the reference clock, wherein at least one of the two possible clock signals is used for storing data in the memory means.

18. The apparatus as recited in claim 17 wherein the predetermined frequency range is from approximately 50 KHz to approximately 80 MHz and the closed loop bandwidth is less than approximately 175 KHz.

19. The apparatus as recited in claim 17 further including means for selecting the bandwidth of the generating means.

20. The apparatus as recited in claim 19 wherein the bandwidth of the generating means is selectable between at least two frequencies.

21. The apparatus as recited in claim 17 wherein the apparatus meets jitter transfer requirements in addition to jitter attenuation.

22. The method as recited in claim 10 wherein the predetermined frequency range is from approximately 50 KHz to approximately 80 MHz and the closed loop bandwidth is less than approximately 175 KHz.

23. The integrated circuit as recited in claim 1 wherein the predetermined frequency range is from approximately 50 KHz to approximately 80 MHz and the closed loop bandwidth is less than approximately 175 KHz.

24. The apparatus as recited in claim 17 wherein the predetermined frequency range is from approximately 12 KHz to approximately 20 MHz and the closed loop bandwidth is less than approximately 40 KHz.

25. The method as recited in claim 10 wherein the predetermined frequency range is from approximately 12 KHz to approximately 20 MHz and the closed loop bandwidth is less than approximately 40 KHz.

* * * * *

UNITED STATES PATENT AND TRADEMARK OFFICE

CERTIFICATE OF CORRECTION

PATENT NO. : 6,987,424 B1
DATED : January 17, 2006
INVENTOR(S) : Jerrell Hein

It is certified that error appears in the above-identified patent and that said Letters Patent is hereby corrected as shown below:

Column 10,
Line 61, replace “sigal” with -- signal --;

Column 11,
Line 3, replace “rant” with -- range --.

Signed and Sealed this

Thirtieth Day of May, 2006

JON W. DUDAS
*Director of the United States Patent and Trademark Office*